(12) United States Patent
Bedell et al.

(10) Patent No.: US 6,972,247 B2
(45) Date of Patent: Dec. 6, 2005

(54) METHOD OF FABRICATING STRAINED SI SOI WAFERS

(75) Inventors: Stephen W. Bedell, Wappingers Falls, NY (US); Guy M. Cohen, Mohegan Lake, NY (US); Huajie Chen, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 10/728,519

(22) Filed: Dec. 5, 2003

(65) Prior Publication Data

US 2005/0124146 A1 Jun. 9, 2005

(51) Int. Cl.$^7$ ............................................. H01L 21/425
(52) U.S. Cl. ........................ 438/517; 438/479; 438/766
(58) Field of Search ............................... 438/198, 291, 438/404, 479, 486, 517, 766

(56) References Cited

U.S. PATENT DOCUMENTS 6,774,015 B1 * 8/2004 Cohen et al. ............... 438/479
6,825,102 B1 * 11/2004 Bedell et al. ............... 438/486

\* cited by examiner

*Primary Examiner*—Phuc T. Dang
(74) *Attorney, Agent, or Firm*—Scully, Scott, Murphy & Presser; Robert M. Trepp, Esq.

(57) ABSTRACT

A method of fabricating a strained semiconductor-on-insulator (SSOI) substrate in which the strained semiconductor is a thin semiconductor layer having a thickness of less than 50 nm that is located directly atop an insulator layer of a preformed silicon-on-insulator substrate is provided. Wafer bonding is not employed in forming the SSOI substrate of the present invention.

67 Claims, 4 Drawing Sheets

METHOD OF FABRICATING STRAINED SI SOI WAFERS

FIELD OF THE INVENTION

The present invention relates to a method of fabricating a semiconductor substrate, and more particularly to a method of fabricating a strained semiconductor-on-insulator (SSOI) substrate.

BACKGROUND OF THE INVENTION

Strained Si has been adopted as a promising option to improve complementary metal oxide semiconductor (CMOS)-based transistor device performance. Typically, Si is deposited on a layer of relaxed SiGe to produce a Si layer that is under tensile strain. Strained Si on SiGe has also been used in conjunction with silicon-on-insulator (SOI) to combine the benefits of both technologies. In some applications, it would be ideal to have a strained Si layer directly over an insulating layer without an intervening SiGe layer; this will allow an ultra thin SOI layer which is consistent with the current trend of SOI technology development. In addition, the intervening SiGe layer causes additional complication in processes such as, for example, enhanced N-type dopant diffusion, Si/SiGe intermixing, shallow trench isolation (STI) process complications, and possible negative effects on silicide formation.

One method of fabricating strained Si directly on an insulating layer involves using a thick graded SiGe buffer layer, chemical mechanical polishing (CMP), strained Si growth, wafer bonding, layer transfer, and SiGe etch back. This prior method has an intrinsic complication because wafer bonding requires very smooth surfaces, and graded SiGe films have a very rough surface which makes SiGe films not suitable for use in most wafer bonding processes. CMP is used in the prior art method to make the surfaces smoother, but CMP reduces the substrate manufacturability, especially for 300 mm wafers.

Another method of forming strained-Si directly on an insulating layer involves growing a thick, relaxed SiGe layer having a thickness of about 400 nm or greater directly on a SOI wafer. The topmost region of the relaxed SiGe layer would be designed to have the lowest threading defect density possible (either by step-grading the Ge content or other prior-art methods to reduce the dislocation density). The material below the topmost, relaxed, high-quality SiGe layer would then be amorphized by ion-implantation at a dose and energy which would reduce or annihilate the crystallinity in the region above the buried oxide layer and below the topmost, relaxed SiGe layer. Subsequent recrystallization annealing would be performed to solid-phase epitaxially regrow the amorphized region of the lattice from the topmost layer downwards.

Because the topmost layer is relaxed, high-quality SiGe, recrystallization below this layer would propagate this lattice structure downwards. Therefore, the lowest layer, the original Si layer from the SOI substrate, would recrystallize with the in-plane lattice parameter of the topmost relaxed SiGe layer; and thus be strained in a tensile manner. The SiGe can then be selectively removed providing a strained, low-defect density SOI substrate for high-performance CMOS applications.

The main drawbacks to the abovementioned concept are 1) the questionable ability to grow high-quality thick relaxed SiGe alloy layers with low-enough defect density, 2) the questionable ability to recrystallize through a very thick random alloy without generating new defects, 3) the practical challenge of amorphizing such a large buried region with a conventional implant procedure and 4) minimizing the interdiffusion of Ge into the lower Si layer during all these processing steps.

In view of the above, there is a need for providing a new and improved method of forming a strained semiconductor-on-insulator (SSOI) substrate that does not exhibit any of the drawbacks mentioned above.

SUMMARY OF THE INVENTION

The present invention provides a method of fabricating a strained semiconductor-on-insulator (SSOI) substrate in which the strained semiconductor is a thin semiconductor layer having a thickness of less than 50 nm that is located directly atop an insulator layer. Wafer bonding is not employed in forming the SSOI substrate of the present invention.

An SSOI substrate is provided in the present invention by first forming a second crystalline semiconductor layer, such as, for example, a SiGe alloy layer, that is strained on a surface of a first crystalline semiconductor layer, such as, for example, a top Si-containing layer of a preformed SOI substrate, which is located atop an insulating layer, such as, for example, a buried oxide of the preformed SOI substrate.

After forming the second crystalline semiconductor layer, an optional defect creating ion implantation step is typically, but not always, performed. As indicated, the optional implant step creates defects within or near the first crystalline semiconductor layer. A first annealing step is performed on the structure, with or without the optional defect creating implant, to a first temperature that is sufficient to relax the strain of the second crystalline semiconductor layer.

Next, an amphorization ion implantation step is performed on the structure including the now relaxed second crystalline semiconductor layer to create a buried amorphized region within the structure. The buried amorphized region comprises the entirety of the first crystalline semiconductor layer and a lower portion of the relaxed second crystalline semiconductor layer.

A second annealing step is then performed at a second temperature that is sufficient to recrystallize the amorphized region. The second annealing step results in the first semiconductor layer recrystallizing in a strained state. The magnitude of the strain within the first semiconductor layer after recrystallization is determined by the in-plane lattice parameter of the previously formed relaxed second crystalline semiconductor layer.

Next, the second crystalline semiconductor layer is selectively removed to provide a substrate that includes a strained first semiconductor layer located on a surface of an insulating layer of the preformed SOI substrate. That is, the selective removal step of the present invention provides an SSOI substrate that comprises the strained first semiconductor layer that is located atop the insulating layer. Since a preformed SOI substrate is employed in the inventive method, a bottom semiconductor substrate layer is located beneath the insulating layer.

The above steps provide an SSOI substrate in which the strained first semiconductor layer is located atop the entirety of the insulating layer. In an alternative embodiment of the present invention, it is possible to form a patterned SSOI substrate which includes localized regions of strained first semiconductor material located atop an insulating layer of a preformed SOI substrate, and unstrained first semiconductor material abutting the localized regions of strained first semiconductor material.

In the alternative embodiment of the present invention, the defect creating ion implantation step and the amorphization ion implantation step is performed in the same selected areas of the structure including the first crystalline semiconductor layer. As such, during the first annealing step selective relaxation can occur in different preselected regions of the second semiconductor layer. Subsequent processing through the remaining processing steps of the present invention results in a substrate containing localized strained first semiconductor layer regions over the insulating layer abutting unstrained first semiconductor layer regions.

DETAILED DESCRIPTION OF THE INVENTION

Figure 1A:
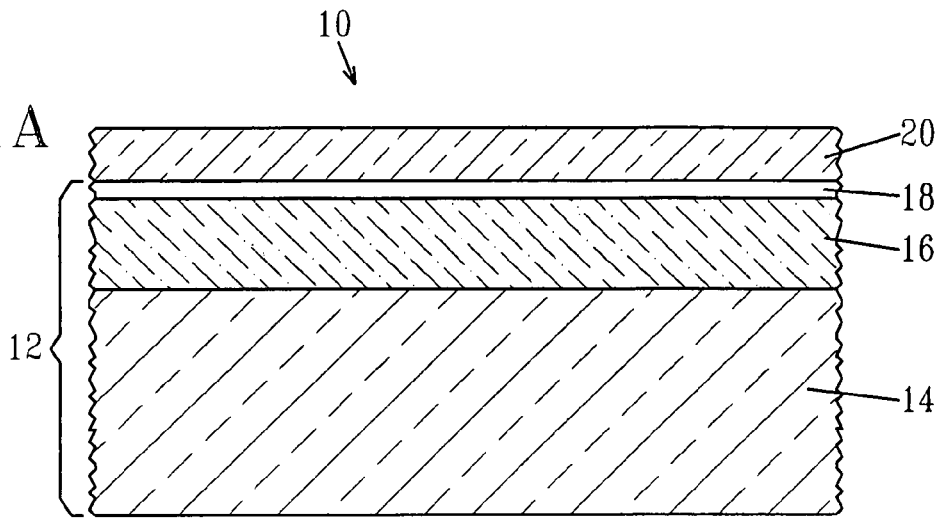
FIGS. 1A–1E are pictorial representations (through cross sectional views) illustrating the basic processing steps that are employed in the present invention in forming a strained semiconductor layer directly on a surface of an insulating layer of a preformed SOI substrate.

The present invention, which provides a method for forming a strained semiconductor-on-insulator substrate, will now be described in greater detail by referring to the drawings that accompany the present application. It is noted that the drawings of the present invention are not drawn to scale therefore the present application is not limited to any dimensions that may be ascertained from the drawings. Moreover, in the accompanying drawings, like reference numerals are employed for describing like and/or corresponding elements.

Reference is first made to FIG. 1A which illustrates a structure 10 that is provided after forming a second crystalline semiconductor layer 20 on a surface of a first crystalline semiconductor layer 18. The first crystalline semiconductor layer 18 represents the topmost layer of a preformed SOI substrate 12. The first semiconductor layer 18 is oftentimes referred to in the art as an SOI layer wherein electrical devices such as, for example, transistors and/or capacitors, can be formed. In addition to the first crystalline semiconductor layer 18, the preformed SOI substrate 12 also includes an insulating layer 16 and a bottom semiconductor substrate layer 14.

The preformed SOI substrate 12 shown in FIG. 1A can be formed utilizing a conventional SIMOX (separation by ion implantation of oxygen) process well known to those skilled in the art, as well as the various SIMOX processes mentioned in co-assigned U.S. Pat. No. 6,486,037, issued Nov. 26, 2002; U.S. Pat. No. 6,602,757, issued Aug. 5, 2003; U.S. Pat. No. 6,541,356 issued Apr. 1, 2003; U.S. patent application Ser. No. 09/861,590, filed May 21, 2001; and Ser. No. 09/884,670, filed Jun. 19, 2001 as well as U.S. Pat. No. 5,930,634 to Sadana, et al., the entire contents of each are incorporated herein by reference.

Alternatively, the preformed SOI substrate 12 may be made using other processes including, for example, a thermal bonding and layer transfer process.

As stated above, the preformed SOI substrate 12 includes a bottom semiconductor substrate layer 14, an insulating layer 16 and a first crystalline semiconductor layer 18. The bottom semiconductor substrate layer 14 of preformed SOI substrate 12 comprises any semiconductor material including, for example, Si, SiC, SiGe, SiGeC, Ge, GaAs, InAs, InP as well as other III/V or II/VI compound semiconductors. In some embodiments, the bottom semiconductor substrate layer 14 can be an SOI substrate or a SiGe-on-insulator substrate.

Insulating layer 16 of the preformed SOI substrate 12 comprises an insulator that is highly resistant to Ge diffusion. Examples of such insulating and Ge diffusion resistant materials include, but are not limited to: crystalline or non-crystalline oxides or nitrides. Typically, the insulating layer 16 of the preformed SOI substrate 12 is a buried oxide layer.

The first crystalline semiconductor layer 18 of the preformed SOI substrate 12 comprises any semiconductor material including, for example, Si, SiC, SiGe, SiGeC, Ge, GaAs, InAs, InP as well as other III/V or II/VI compound semiconductors. In a preferred embodiment of the present invention, the first crystalline semiconductor layer 18 is comprised of a Si-containing material.

The thickness of the various layers of the preformed SOI substrate 12 may vary depending on the process used in making the same. Typically, however, the first crystalline semiconductor layer 18 is a thin layer that has a thickness from about 1 to about 50 nm, with a thickness from about 5 to about 40 nm being more typical. In the case of the insulating layer 16, that layer typically has a thickness from about 1 to about 1000 nm, with a thickness from about 20 to about 200 nm being more highly preferred. The thickness of the semiconductor substrate layer 14 is inconsequential to the present invention. The thickness ranges provided above are exemplary and by no ways limit the scope of the present invention.

After providing the preformed SOI substrate 12 including the first crystalline semiconductor layer 18, a second crystalline semiconductor layer 20 that is in a strained state is formed atop the first crystalline semiconductor layer 18. The second crystalline semiconductor layer 20 may be comprised of the same or different semiconductor material as the first crystalline semiconductor layer 18 with the proviso being that the second crystalline semiconductor layer 20 is formed in a strained state.

In a preferred embodiment, the second crystalline semiconductor layer 20 is a Ge-containing layer that includes a SiGe alloy or pure Ge. The term "SiGe alloy" includes SiGe materials that comprise up to 99.99 atomic percent Ge, whereas pure Ge includes layers that comprise 100 atomic percent Ge. When SiGe layers are employed, it is preferred that the Ge content in the SiGe layer be from about 0.1 to about 99.9 atomic percent, with a Ge atomic percent from about 10 to about 35 being even more highly preferred.

In accordance with the present invention, the second crystalline semiconductor layer 20 is formed atop the first crystalline semiconductor layer 18 using any conventional epitaxial growth method that is well known to those skilled in the art that is capable of growing a semiconductor material that is strained, metastable, pseudomorphic as well as being substantially free from defects, i.e., misfit and TD dislocations. Illustrative examples of such epitaxial growing processes include, but are not limited to: Rapid thermal chemical vapor deposition (RTCVD), low-pressure chemical vapor deposition (LPCVD), ultra-high vacuum chemical vapor deposition (UHVCVD), atmospheric pressure chemical vapor deposition (APCVD), molecular beam (MBE) epitaxy or plasma-enhanced chemical vapor deposition (PECVD).

The thickness of the second crystalline semiconductor layer 20 formed at this point of the present invention may vary, but generally the second crystalline semiconductor layer 20 has a thickness that is greater than the underlying first crystalline semiconductor layer 18. Typically, the second crystalline semiconductor layer 20 has a thickness from about 10 to about 500 nm, with a thickness from about 20 to about 200 nm being more typical.

After forming the structure shown in FIG. 1A, an optional defect creating ion implantation step is typically performed on the structure including the second crystalline semiconductor layer 20 formed on top of the first crystalline semiconductor layer 18 to create defects within or near the first crystalline semiconductor layer 18. The defects created from this implantation step allow enhanced strain relaxation of the second crystalline semiconductor layer 20 to occur. Examples of such defects that permit enhanced relaxation to occur include: platelet defects or bubble-like defects, as in the case for hydrogen ion implantation. The optional implant may be performed with or without the use of an implantation mask.

Figure 1B:
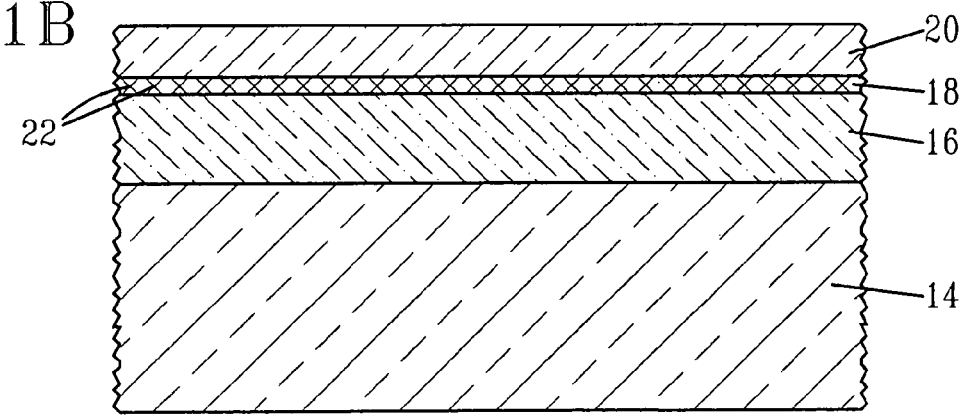

The structure that is formed after this optional implantation step is shown in FIG. 1B. In this figure, reference numeral 22 denotes the defects formed within the first crystalline semiconductor layer 18 by this ion implantation step. The defect creating ion implantation step solves the problem of defect production in the second crystalline semiconductor/first crystalline semiconductor bilayer (18 and 20) by creating a random array of dislocation nucleation sites that facilitate strain relaxation upon subsequent heating. Specifically, elastic relaxation of the second crystalline semiconductor layer 20 occurs by plastic deformation of the first crystalline semiconductor layer 18 facilitated by the defects formed during the ion implantation step.

The defects, which permit enhanced relaxation of the second crystalline semiconductor layer 20 to occur, are formed by implanting ions such as hydrogen, deuterium, helium, oxygen, neon, boron, silicon or mixtures thereof into the various layers using implant conditions which maintain the peak of the ion range within or near the first crystalline semiconductor layer 18. Isotopes of the aforementioned ions are also contemplated herein. Preferred ions used in the present invention to create defects are hydrogen ions ($H^+$) or oxygen ions ($O^+$). It is noted that other species of hydrogen such as $H_2^+$ can also contemplated herein.

The optional defect creating implant step of the present invention is conducted at approximately room temperature, i.e., a temperature from about 283K to about 303K, using a beam current density from about 0.01 to about 10 microamps/$cm^2$. Implantation at different temperatures and/or using other beam current densities may affect the relaxation behavior.

The concentration of the implant species used in forming the defects 22 may vary depending upon the type of implant species employed. Typically, however, the concentration of implanting ions used at this point of the present invention is below $3E16$ $cm^{-2}$, with an ion concentration from about $1E15$ to about $2.99E16$ $cm^{-2}$ being more typical. The energy of this optional implant may also vary depending upon the type of ion that is being implanted, with the proviso that the implant energy must be capable of positioning ions within or near the first crystalline semiconductor layer 18.

For example, when hydrogen is employed as the implant ion, the energy used to ensure defect formation within or near the first crystalline semiconductor layer 18 is from about 1 to about 100 keV, with an energy from about 3 to about 40 keV being more highly preferred.

The implantation of the foregoing energetic ions within or near the first crystalline semiconductor layer 18 creates defects that can serve as efficient dislocation nucleation sites which allow the second crystalline semiconductor layer 20 to relax more efficiently by preferentially driving dislocation defects into the first crystalline semiconductor layer 18. The randomness of the defect sites caused by the defect creating ion implantation step also reduces defect pinning caused by interactions between moving dislocations and thereby makes the relaxation process more efficient. In addition to the foregoing, the optional defect creating ion implantation step also lowers the temperature required to relax the second crystalline semiconductor layer 20 during the subsequent first annealing step.

After forming the structure shown in FIG. 1A, or optional FIG. 1lB, the structure is then subjected to a first annealing step that is conducted at a first temperature that is sufficient to relax the strain on the second crystalline semiconductor layer 20. The first annealing step is performed in an inert gas ambient that may be optionally mixed with a small (less than 1%) concentration of oxygen or, alternatively, a forming gas may be employed. Illustrative examples of inert gas ambients that can be employed in the first annealing step include He, Ar, $N_2$, Xe, Kr, Ne or mixtures thereof such as, for example, a He—Ar or He—$N_2$ mixture.

As indicated above, the first annealing step is performed at a first temperature that is sufficient to relax the strain of the second crystalline semiconductor layer 20. Additionally, the first temperature minimizes the diffusion of Ge within the structure. Specifically, the first temperature of the first annealing step is from about 700° C. to about 1100° C., with a first temperature from about 800° C. to about 1050° C. being more highly preferred. The time period for the first annealing step may vary, but typically the first annealing step is performed for a time period from about 1 second to about 5 hours, with a time period from about 5 seconds to 1 hour being more typical.

The first annealing step may be carried out using a rapid thermal annealing process, a furnace annealing process, a laser anneal, a spike anneal or any other like annealing process that is capable of causing sufficient relaxation of the strained second semiconductor layer 20. Rapid thermal annealing is typically carried out at shorter periods of time as compared with furnace annealing. The first annealing step may be carried out using a single ramp temperature, or various ramp and soak cycles can be employed.

It is again emphasized that during the first annealing step relaxation of the second crystalline semiconductor layer 20 occurs. The degree of relaxation achieved during this annealing step of the present invention is a function of the initial strain in the second crystalline semiconductor layer 20 as well as the thickness of that layer. Typically, the degree of relaxation achieved during the step of the present invention is greater than 25%.

Figure 1C:
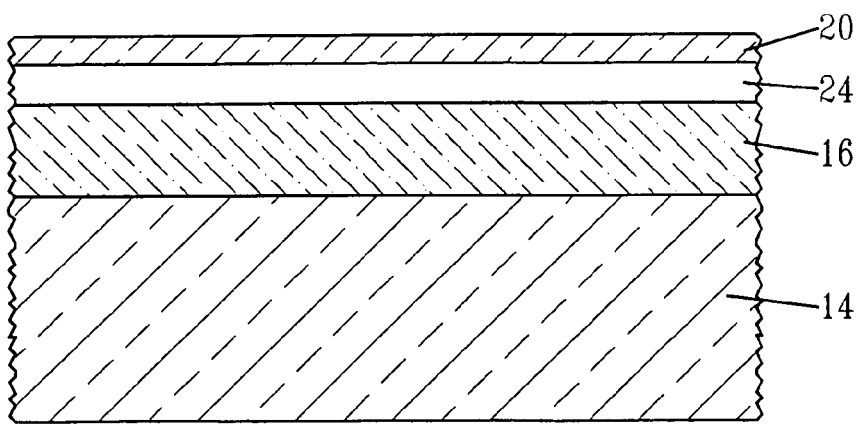

Next, an amorphization ion implantation step is performed to create a structure in which an amorphized region 24 comprising the entirety of the first crystalline semiconductor layer 18 and a lower portion of the second crystalline semiconductor layer 20. The resultant structure is shown in FIG. 1C. The peak of the damaged depth profile resulting from this implantation is commensurate with the first crystalline semiconductor layer 18. That is, the amorphization occurs by ion implanting the peak of the ion range within a range of ±1000 Å with respect to the center of the first crystalline semiconductor layer 18. More preferably, the amorphization occurs by implanting the ion peak within ±500 Å of the center of the first crystalline semiconductor layer 18. Amorphization ions such as Si, P, As, Ge, C or any combination including isotopes thereof can be used in the present invention. Any range of doses and energies that are sufficient to cause amorphization and to implant the ion peak within the ranges mentioned above may be used in the present invention.

Figure 1D:
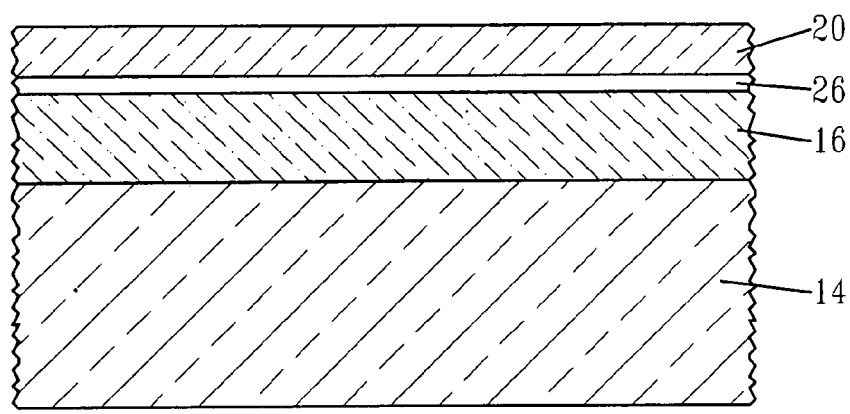

FIG. 1D shows the structure that is formed after performing a second annealing step. In accordance with the present invention, and as is shown in FIG. 1D, the second annealing step is performed at a second temperature that is sufficient to recrystallize the amorphized region 24 resulting in the first crystalline semiconductor layer 18 recrystallizing in a strained state; the magnitude of the strain is determined by the in-plane lattice parameter of the relaxed second crystalline semiconductor layer 20. The recrystallized first semiconductor layer is denoted by reference numeral 26 in FIG. 1D.

The second annealing step is performed in an inert gas ambient that may be optionally mixed with a small (less than 1%) concentration of oxygen or, alternatively, a forming gas may be employed. Illustrative examples of inert gas ambients that can be employed in the second annealing step include He, Ar, $N_2$, Xe, Kr, Ne or mixtures thereof such as, for example, a He—Ar or He—$N_2$ mixture.

As indicated above, the second annealing step is performed at a second temperature that is sufficient to cause the first crystalline semiconductor layer 18 to recrystallize in a strained state. Hence, the resulting first semiconductor crystalline layer 26 is strained in a tensile manner if the relaxed second crystalline semiconductor layer 20 was initially under compressive strain (prior to relaxation) and strained in a compressive manner if the relaxed second crystalline semiconductor layer 20 was initially under tensile strain. Specifically, the second temperature of the second annealing step is from about 600° C. to about 1100° C., with a second temperature from about 800° C. to about 1050° C. being more highly preferred. The time period for the second annealing step may vary, but typically the second annealing step is performed for a time period from about 1 sec to about 5 hours, with a time period from about 5 sec to 1 hour being more typical.

The second annealing step may be carried out using a rapid thermal annealing process, a furnace annealing process, a laser anneal, a spike anneal or any other like annealing process that is capable of causing the amorphized region 24 as well as the first crystalline semiconductor layer 18 to recrystallize in a strained manner. Rapid thermal annealing is typically carried out at shorter periods of time as compared with furnace annealing. The second annealing step may be carried out using a single ramp temperature, or various ramp and soak cycles can be employed.

Figure 1E:
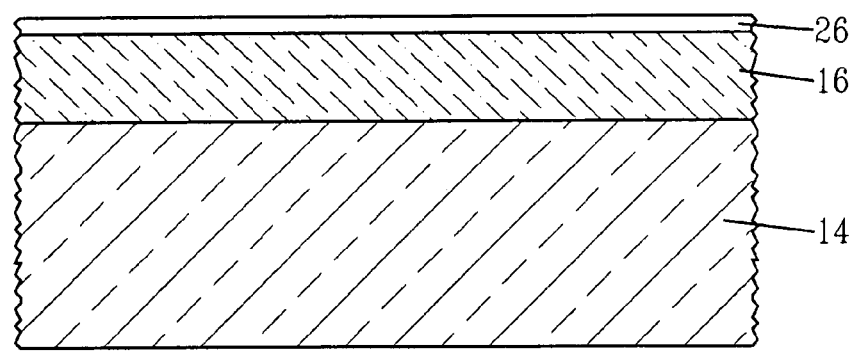

After conducting the second annealing step, the second crystalline semiconductor layer 20 is removed from the structure providing the SSOI substrate shown in FIG. 1E. In this drawing, the strained first crystalline layer 26 is located directly on the insulating layer 16 of the preformed SOI substrate 12. The thickness of the strained first crystalline semiconductor layer 26 is typically from about 50 to about 500 Å, with a thickness from about 100 to about 400 Å being more typical. Note these thickness ranges are similar to the original thickness of layer 18; a slightly thinner layer may result. The degree of strain imparted is determined by the in-plane lattice parameter of the previously formed relaxed second crystalline semiconductor layer.

Next, the second crystalline semiconductor layer 20 is removed in the present invention using a selective removal process including, for example, chemical etching, reactive ion etching, low-temperature oxidation, atomic oxidation, chemical mechanical polishing (CMP), gas-cluster beam thinning or any combination thereof.

Figure 2A:
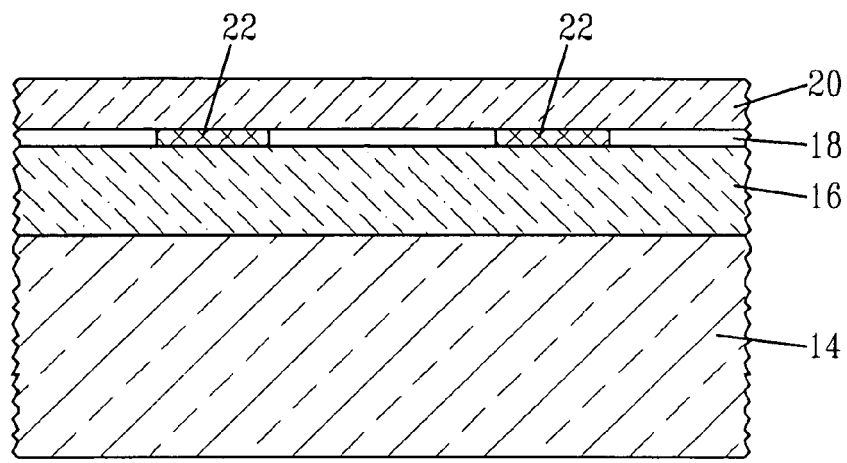
FIGS. 2A–2B are pictorial representations (through cross sectional views) illustrating an alternative embodiment of the present invention.
Figure 2B:
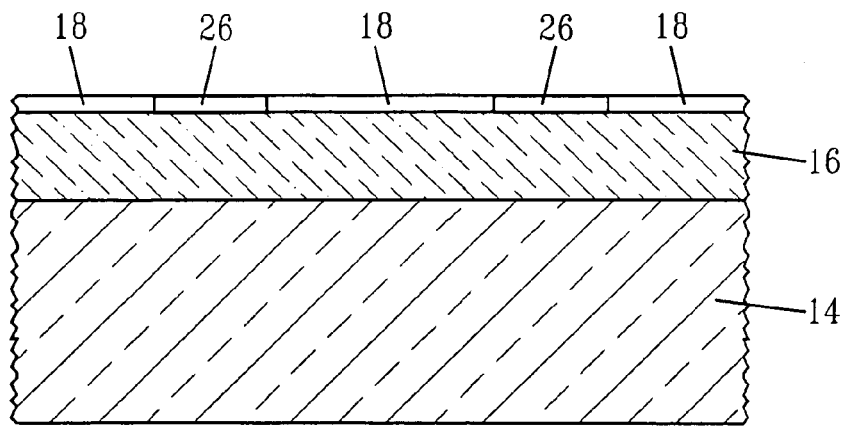

As shown in FIG. 1E, the strained first semiconductor layer 26 is located atop the entirety of the insulating layer 16. In addition to the embodiment depicted in FIGS. 1A–1E, the present invention also contemplates an alternative embodiment in which a patterned SSOI substrate which includes localized regions of strained first semiconductor material located atop an insulating layer of a preformed SOI substrate, and unstrained first semiconductor material abutting the localized regions of strained material is formed. This embodiment of the present invention is depicted in FIGS. 2A–2B.

In the alternative embodiment of the present invention, the defect creating ion implantation step and the amorphization ion implantation step is performed in the same selected areas of the structure including the first crystalline semiconductor layer. The alternative structure is depicted in FIG. 2A. During the first annealing step selective relaxation can occur in different preselected regions of the second semiconductor layer. Subsequent processing through the remaining processing steps of the present invention described above results in a substrate containing localized strained first semiconductor layer regions 26 over the insulating layer 16 abutting unstrained first semiconductor layer regions 18. This SSOI substrate is shown in FIG. 2B.

Figure 3:
FIG. 3 is an XTEM of a substrate after performing the first annealing step of the present invention showing the dislocations preferentially located in the SOI layer.

FIG. 3 is an XTEM of a substrate after performing the annealing step of the present invention in which the SiGe layer is made to relax by preferentially driving dislocations into the SOI layer. The simple cross sectional view for this step of the present invention is shown, for example, in FIG. 1B. This sample contained a 550 Å-30% SiGe layer grown on a 200 Å SOI layer that was implanted with H at a dose of 2.5E16 atoms/cm$^2$ to a depth which placed the peak H concentration near the SOI/buried oxide interface, and annealed using rapid thermal annealing (50° C./sec) at 900° C. for 5 minutes. The SiGe layer was measured using X-ray diffraction to be 29.9% Ge and 61% relaxed.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of fabricating a strained semiconductor-on-insulator (SSOI) comprising the steps of:
    forming a second crystalline semiconductor layer that is strained on a surface of a first crystalline semiconductor layer, said first crystalline semiconductor layer is located atop an insulating layer of a preformed silicon-on-insulator (SOI) substrate, said insulating layer is a crystalline or non-crystalline oxide or nitride that is highly resistant to Ge diffusion;
    subjecting the preformed SOI substrate containing the second crystalline semiconductor layer to a first annealing step at a first temperature that is sufficient to relax the strain in the second crystalline semiconductor layer;

performing an amorphization ion implantation to create a buried amorphized region comprising the entirety of the first crystalline semiconductor layer and a lower portion of the second crystalline semiconductor layer;

subjecting the preformed SOI substrate containing the second crystalline semiconductor layer and the buried amorphized region to a second annealing step at a second temperature sufficient to recrystallize the buried amorphized region resulting in said first crystalline semiconductor layer recrystallizing in a strained state; and selectively removing the second crystalline semiconductor layer providing a strained semiconductor-on-insulator substrate.

2. The method of claim 1 wherein the first crystalline semiconductor layer has thickness from about 5 to about 50 nm.

3. The method of claim 1 wherein the first crystalline semiconductor layer comprises Si, SiC, SiGe, SiGeC, Ge, GaAs, InAs, InP, another III/V or II/VI compound semiconductor.

4. The method of claim 3 wherein the first crystalline semiconductor layer is a Si-containing semiconductor.

5. The method of claim 1 wherein the second crystalline semiconductor layer comprises Si, SiC, SiGe, SiGeC, Ge, GaAs, InAs, InP, another III/V or II/VI compound semiconductor.

6. The method of claim 5 wherein the second crystalline semiconductor layer is a Ge-containing material.

7. The method of claim 6 wherein the Ge-containing material is a SiGe alloy or pure Ge.

8. The method of claim 1 wherein forming the second crystalline semiconductor layer comprises an epitaxial growth process.

9. The method of claim 8 wherein the epitaxial growth process is selected from rapid thermal chemical vapor deposition, low-pressure chemical vapor deposition, ultra-high vacuum chemical vapor deposition, atmospheric pressure chemical vapor deposition, molecular beam epitaxy and plasma-enhanced chemical vapor deposition.

10. The method of claim 1 wherein the second crystalline semiconductor layer has a thickness from about 10 to about 500 nm.

11. The method of claim 1 further comprising performing a defect creating ion implantation to create defects within or near the first crystalline semiconductor layer between said forming and first annealing step.

12. The method of claim 11 wherein the defect creating ion implantation is carried out using ions of hydrogen, deuterium, helium, oxygen, neon, boron, silicon or mixtures and isotopes thereof.

13. The method of claim 12 wherein the ions are hydrogen or oxygen ions.

14. The method of claim 11 wherein the defect creating ion implantation is carried out using an ion concentration of below $3E16$ $cm^{-1}$.

15. The method of claim 11 wherein the defects serve as efficient dislocation nucleation sites which allow the second crystalline semiconductor layer to relax more efficiently.

16. The method of claim 11 wherein the defect creating ion implantation is performed using an implantation mask.

17. The method of claim 1 wherein the first annealing step is performed in an inert gas ambient or a forming gas ambient.

18. The method of claim 1 wherein the first temperature of the first annealing step is from about 700° C. to about 1100° C.

19. The method of claim 1 wherein the first annealing step is carried out using a rapid thermal annealing process, a furnace annealing process, a laser annealing process of a spike anneal.

20. The method of claim 1 wherein the amorphization ion implantation is carried out using ions selected from Si, P, As, Ge, C and any combination thereof.

21. The method of claim 1 wherein the second annealing step is performed in an inert gas ambient or a forming gas ambient.

22. The method of claim 1 wherein the second temperature of the second annealing step is from about 600° C. to about 1100° C.

23. The method of claim 1 wherein the second annealing step is carried out using a rapid thermal annealing process, a furnace annealing process, a laser annealing process of a spike anneal.

24. The method of claim 1 wherein the selectively removing comprises chemical etching, reactive ion etching, low-temperature oxidation, atomic oxidation, chemical mechanical polishing, gas-cluster beam thinning or any combination thereof.

25. A method of fabricating a strained semiconductor-on-insulator (SSOI) comprising the steps of:

forming a second crystalline semiconductor layer that is strained on a surface of a first crystalline semiconductor layer, said first crystalline semiconductor layer is located atop an insulating layer of a preformed silicon-on-insulator (SOI) substrate, said insulating layer is a crystalline or non-crystalline oxide or nitride that is highly resistant to Ge diffusion;

performing a defect creating ion implantation to create defects within or near the first crystalline semiconductor layer;

subjecting the preformed SOI substrate containing the second crystalline semiconductor layer and the defects to a first annealing step at a first temperature that is sufficient to relax the strain in the second crystalline semiconductor layer;

performing an amorphization ion implantation to create a buried amorphized region comprising the entirety of the first crystalline semiconductor layer and a lower portion of the second crystalline semiconductor layer;

subjecting the preformed SOI substrate containing the second crystalline semiconductor layer and the buried amorphized region to a second annealing step at a second temperature sufficient to recrystallize the buried amorphized region resulting in said first crystalline semiconductor layer recrystallizing in a strained state; and selectively removing the second crystalline semiconductor layer providing a strained semiconductor-on-insulator substrate.

26. The method of claim 25 wherein the first crystalline semiconductor layer has thickness from about 5 to about 50 nm.

27. The method of claim 25 wherein the first crystalline semiconductor layer comprises Si, SiC, SiGe, SiGeC, Ge, GaAs, InAs, InP, another III/V or II/VI compound semiconductor.

28. The method of claim 27 wherein the first crystalline semiconductor layer is a Si-containing semiconductor.

29. The method of claim 25 wherein the second crystalline semiconductor layer comprises Si, SiC, SiGe, SiGeC, Ge, GaAs, InAs, InP, another III/V or II/VI compound semiconductor.

30. The method of claim 29 wherein the second crystalline semiconductor layer is a Ge-containing material.

31. The method of claim 30 wherein the Ge-containing material is a SiGe alloy or pure Ge.

32. The method of claim 25 wherein forming the second crystalline semiconductor layer comprises an epitaxial growth process.

33. The method of claim 32 wherein the epitaxial growth process is selected from rapid thermal chemical vapor deposition, low-pressure chemical vapor deposition, ultra-high vacuum chemical vapor deposition, atmospheric pressure chemical vapor deposition, molecular beam epitaxy and plasma-enhanced chemical vapor deposition.

34. The method of claim 25 wherein the second crystalline semiconductor layer has a thickness from about 10 to about 500 nm.

35. The method of claim 25 wherein the defect creating ion implantation is carried out using ions of hydrogen, deuterium, helium, oxygen, neon, boron, silicon or mixtures and isotopes thereof.

36. The method of claim 35 wherein the ions are hydrogen or oxygen ions.

37. The method of claim 25 wherein the defect creating ion implantation is carried out using an ion concentration of below 3E16 cm$^{-2}$.

38. The method of claim 25 wherein the defects serve as efficient dislocation nucleation sites which allow the second crystalline semiconductor layer to relax more efficiently.

39. The method of claim 25 wherein the defect creating ion implantation is performed using an implantation mask.

40. The method of claim 25 wherein the first annealing step is performed in an inert gas ambient or a forming gas ambient.

41. The method of claim 25 wherein the first temperature of the first annealing step is from about 700° C. to about 1100° C.

42. The method of claim 25 wherein the first annealing step is carried out using a rapid thermal annealing process, a furnace annealing process, a laser annealing process or a spike anneal.

43. The method of claim 25 wherein the amorphization ion implantation is carried out using ions selected from Si, P, As, Ge, C and any combination thereof.

44. The method of claim 25 wherein the second annealing step is performed in an inert gas ambient or a forming gas ambient.

45. The method of claim 25 wherein the second temperature of the second annealing step is from about 600° C. to about 1100° C.

46. The method of claim 25 wherein the second annealing step is carried out using a rapid thermal annealing process, a furnace annealing process, a laser annealing process or a spike anneal.

47. The method of claim 25 wherein the selectively removing comprises chemical etching, reactive ion etching, low-temperature oxidation, atomic oxidation, chemical mechanical polishing, gas-cluster beam thinning or any combination thereof.

48. A method of fabricating a strained Si-on-insulator (SSOI) comprising the steps of:
    forming a Ge-containing layer that is strained on a surface of a Si-containing layer, said Si-containing layer is located atop an insulating layer of a preformed silicon-on-insulator (SOI) substrate, said insulating layer is a crystalline or non-crystalline oxide or nitride that is highly resistant to Ge diffusion;
    subjecting the preformed SOI substrate containing the Ge-containing to a first annealing step at a first temperature that is sufficient to relax the strain in the Ge-containing layer;
    performing an amorphization ion implantation to create a buried amorphized region comprising the entirety of the Si-containing layer and a lower portion of the Ge-containing layer;
    subjecting the preformed SOI substrate containing the Ge-containing layer and the buried amorphized region to a second annealing step at a second temperature sufficient to recrystallize the buried amorphized region resulting in said Si-containing layer recrystallizing in a strained state; and
    selectively removing the Ge-containing layer providing a strained Si-containing-on-insulator substrate.

49. The method of claim 48 wherein the insulating layer is a crystalline or non-crystalline oxide or nitride that is highly resistant to Ge diffusion.

50. The method of claim 48 wherein the Si-containing layer has thickness from about 5 to about 50 nm.

51. The method of claim 48 wherein the Ge-containing layer is a SiGe alloy or pure Ge.

52. The method of claim 48 wherein the forming the Ge-containing layer comprises an epitaxial growth process selected from rapid thermal chemical vapor deposition, low-pressure chemical vapor deposition, ultra-high vacuum chemical vapor deposition, atmospheric pressure chemical vapor deposition, molecular beam epitaxy and plasma-enhanced chemical vapor deposition.

53. The method of claim 48 wherein the Ge-containing layer has a thickness from about to about 500 nm.

54. The method of claim 48 further comprising performing a defect creating ion implantation to create defects within or near the first crystalline semiconductor layer between said forming and first annealing step.

55. The method of claim 54 wherein the defect creating ion implantation is carried out using ions of hydrogen, deuterium, helium, oxygen, neon, boron, silicon or mixtures and isotopes thereof.

56. The method of claim 55 wherein the ions are hydrogen or oxygen ions.

57. The method of claim 55 wherein the defect creating ion implantation is carried out using an ion concentration of below 3E16 cm$^{-2}$.

58. The method of claim 55 wherein the defects serve as efficient dislocation nucleation sites which allow the second crystalline semiconductor layer to relax more efficiently.

59. The method of claim 55 wherein the defect creating ion implantation is performed using an implantation mask.

60. The method of claim 48 wherein the first annealing step is performed in an inert gas ambient or a forming gas ambient.

61. The method of claim 48 wherein the first temperature of the first annealing step is from about 700° C. to about 1100° C.

62. The method of claim 48 wherein the first annealing step is carried out using a rapid thermal annealing process, a furnace annealing process, a laser annealing process or a spike anneal.

63. The method of claim 48 wherein the amorphization ion implantation is carried out using ions selected from Si, P, As, Ge, C and any combination thereof.

64. The method of claim 48 wherein the second annealing step is performed in an inert gas ambient or a forming gas ambient.

65. The method of claim 48 wherein the second temperature of the second annealing step is from about 600° C. to about 1100° C.

66. The method of claim 48 wherein the second annealing step is carried out using a rapid thermal annealing process, a furnace annealing process, a laser annealing process or a spike anneal.

67. The method of claim 48 wherein the selectively removing comprises chemical etching, reactive ion etching, low-temperature oxidation, atomic oxidation, chemical mechanical polishing, gas-cluster beam thinning or any combination thereof.

* * * * *

UNITED STATES PATENT AND TRADEMARK OFFICE
CERTIFICATE OF CORRECTION

PATENT NO. : 6,972,247 B2 Page 1 of 1
APPLICATION NO. : 10/728519
DATED : December 6, 2005
INVENTOR(S) : Stephen W. Bedell et al.

It is certified that error appears in the above-identified patent and that said Letters Patent is hereby corrected as shown below:

Column 9,
Line 56, "3E16 $cm^{-1}$." should read -- 3E16 $cm^{-2}$. --.

Column 10,
Line 3, "process of a spike anneal." should read -- process or a spike anneal --.
Line 16, "process of a spike anneal" should read -- process or a spike anneal --.

Column 12,
Line 32, "from about to about 500 nm" should read -- from about 10 to about 500 nm --.

Signed and Sealed this

Eleventh Day of July, 2006

JON W. DUDAS
*Director of the United States Patent and Trademark Office*